United States Patent [19]

Bredbenner et al.

[11] Patent Number: 4,919,748

[45] Date of Patent: Apr. 24, 1990

[54] METHOD FOR TAPERED ETCHING

[75] Inventors: Craig N. Bredbenner, Lehighton, Pa.; Troy A. Giniecki, South Plainfield, N.J.; Nur Selamoglu, Philadelphia, Pa.; Hans J. Stocker, Austin, Tex.

[73] Assignee: AT&T Bell Laboratories, Murray Hill, N.J.

[21] Appl. No.: 374,408

[22] Filed: Jun. 30, 1989

[51] Int. Cl.⁵ .......................... C23F 1/02; B44C 1/22; C03C 15/00; C03C 25/06
[52] U.S. Cl. ...................... 156/643; 156/646; 156/656; 156/659.1; 156/665; 204/192.35; 252/79.1
[58] Field of Search ............... 252/79.1; 156/643, 644, 156/646, 652, 656, 659.1, 661.1, 664, 665; 204/192.32, 192.35; 427/38, 39; 430/313, 318

[56] References Cited

U.S. PATENT DOCUMENTS

| 4,082,604 | 4/1978 | Yanez | 156/665 X |
| 4,256,534 | 3/1981 | Levinstein et al. | 156/643 |
| 4,267,013 | 5/1981 | Iida et al. | 252/79.1 X |
| 4,412,885 | 11/1983 | Wang et al. | 252/79.1 X |
| 4,784,719 | 11/1988 | Schutz | 252/79.1 X |
| 4,838,992 | 6/1989 | Abraham | 156/665 X |

OTHER PUBLICATIONS

IEDM 1986, "A1 Tapered Etching Application to Submicron Multilevel Interconnection Process", T. Arikado et al., pp. 54–57.

Primary Examiner—William A. Powell
Attorney, Agent, or Firm—John T. Rehberg

[57] ABSTRACT

A method for etching metal layers including aluminum to create tapered sidewalls is disclosed. The method features the use of trifluoromethane and chlorine in controlled amounts to create a tapered metal layer profile.

6 Claims, 3 Drawing Sheets

METHOD FOR TAPERED ETCHING

TECHNICAL FIELD

This invention relates to methods and apparatus for the manufacture of semiconductor integrated circuits and more particularly to methods and apparatus for the fabrication of patterned conductors in such circuits.

BACKGROUND OF THE INVENTION

In the manufacture of integrated circuits, individual transistors are customarily interconnected with conductors, sometimes termed "runners." Interconnections are typically formed by processes which involve blanket depositing a layer of conductive material and then covering the conductive material with a photoresist. The photoresist is then usually exposed to light and (depending upon whether the photoresist is a "positive" or "negative" photoresist) either the exposed or the unexposed portion of the photoresist is washed away. The remaining photoresist covers a portion of the blanket conductive material, leaving other portions exposed. Next, the exposed conductive material is etched away by various means, leaving the desired conductive interconnections.

Aluminum is frequently used as a material for forming conductive interconnections in integrated circuits. A variety of aluminum etching techniques are in use. One example is found in U.S. Pat. No. 4,256,534 issued to Levinstein et al. The Levinstein et al. patent illustrates the etching of aluminum and aluminum-rich alloys by the use of halide- halogen combinations, such as e.g., boron trichloride and chlorine.

Another example of an aluminum etching technique is contained in: Arikado et al., "Al Tapered Etching Application to Submicron Multilevel Interconnection Process", IEDM pp. 54–57, 1986. The Arikado publication illusrates the use of chloroform together with chlorine to produce aluminum runners with tapered sidewalls. The tapered sidewalls are created in an effort to improve subsequent dielectric deposition.

SUMMARY OF THE INVENTION

The present invention produces a tapered sidewall in various materials including aluminum-containing materials and in layered structures by the use of trifluoromethane (sold under the trademark "Freon 23") together with chlorine. Adjustment of the amounts of chlorine and trifluoromethane permits control of the taper angle. If desired, boron trichloride may be introduced into the etching reaction, principally to remove aluminum oxide (when it is present).

BRIEF DESCRIPTION OF THE DRAWING

FIGS. 4 and 5 are graphs which illustrate the relationships between taper angle and etching parameters.

DETAILED DESCRIPTION

Figure 1:
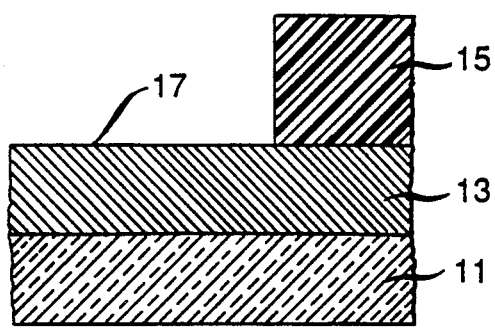
FIGS. 1, 2 and 3 are partial cross sectional views illustrating an exemplary processing sequence in the practice of the present invention.

In FIG. 1, reference numeral 11 denotes a substrate which may consist essentially of, for example, silicon dioxide, silicon, silicon nitride, or another suitable material.

Reference numeral 13 denotes a layer of blanket aluminum or an aluminum rich composition for example, an aluminum-copper alloy, an aluminum-silicon alloy, or an aluminum-copper- silicon alloy. Reference numeral 13 may also denote a layered structure having one or more layers of the above-mentioned aluminum-rich compositions together with layers of titanium nitride, or titanium-tungsten or titanium. For example, reference numeral 13 may denote a layer of titanium-tungsten beneath a layer of an aluminum-rich composition. Alternatively, reference numeral 13 may denote a triple-layered structure with an aluminum-rich composition between two layers of titanium tungsten. By way of further example, reference numeral 13 may denote a layer of titanium-tungsten above a layer of an aluminum-rich composition. Alternatively, titanium nitride may be substituted for titanium-tungsten in the above examples. For simplicity, layer 13 will be simply termed the "metal layer" in subsequent discussion.

The layered structures described above are used in the fabrication of semiconductor integrated circuits to provide runners with greater adhesion and electromigration resistance. The titanium nitride or titanium-tungsten layers beneath the aluminum tend to improve adhesion of the aluminum to underlying oxides, tend to prevent spiking of aluminum into silicon (in those places where the aluminum might contact silicon) and serve to improve adhesion between the aluminum and an underlying oxide. Typically, more than five percent titanium is added to tungsten, with roughly ten percent titanium being typical. Additionally, an overlying layer of titanium tungsten or titanium nitride may be employed as an anti reflection coating. Since the titanium nitride or titanium tungsten layers are also deposited in a blanket fashion, it is necessary to etch through them as well as through the aluminum. In some applications the thickness of the titanium-tungsten or titanium nitride layer may be 1000–2000 Å (or even less) and the aluminum may be 0.5 $\mu$m or 1.0 $\mu$m. Those concerned with the development of semiconductor technology have consistently sought etching methods which will etch layered structures such as those described above without necessitating a change of chemistry. As will be described in further detail below, the present invention satisfies the above need while producing a structure with a tapered sidewall.

Reference numeral 15 denotes a resist material (or other mask material) which may be, for example, HPR 206 photoresist (a proprietary product of Hunt Chemical Company, which is basically a novolak resin with a quinone diazide sensitizer). Mask 15 has been patterned, leaving surface 17 of metal layer 13 exposed. Alternatively, a tri-level resist scheme may be employed, if desired.

An etching procedure is next performed to attack the exposed portion 17 of layer 13. Typically, the structure of FIG. 1 is transferred to the powered cathode of an hexagonal cathode etching apparatus, although other etching apparatus may also be utilized. The chamber is evacuated and etchant gases (to be described later) are introduced.

Figure 2:
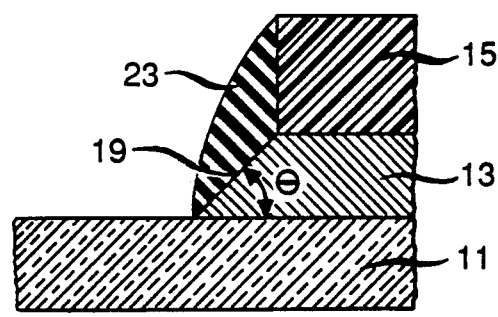

The structure illustrated in FIG. 2 is representative of what is produced at the end of the etching process. Examination of FIG. 2 shows that the exposed surface 17 of metal layer 13 has been etched away, leaving a tapered sidewall 19. It was found that the angle $\theta$ measured between sidewall surface 19 and substrate surface 11 is strongly governed by the relative proportions of trifluoromethane and chlorine used during the etching process (although other parameters also play a role which will be discussed subsequently). It will be noted that a polymeric layer 23 has been formed during the etching process. Polymeric layer 23 contacts sidewall 19 of layer 13 and also contacts resist 15.

As will be further explained below, it has been hypothesized that formation of polymeric layer 23 provides protection from the etchant species for metal sidewall 19 during the process of its formation. Consequently, the tapered sidewall profile illustrated in FIG. 2 is obtained.

Figure 3:
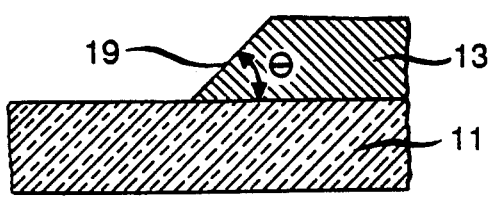

FIG. 3 illustrates the structure of FIG. 2 after mask 15 and polymeric film 23 have been removed. The structure is ready for further semiconductor processing.

Figure 4:
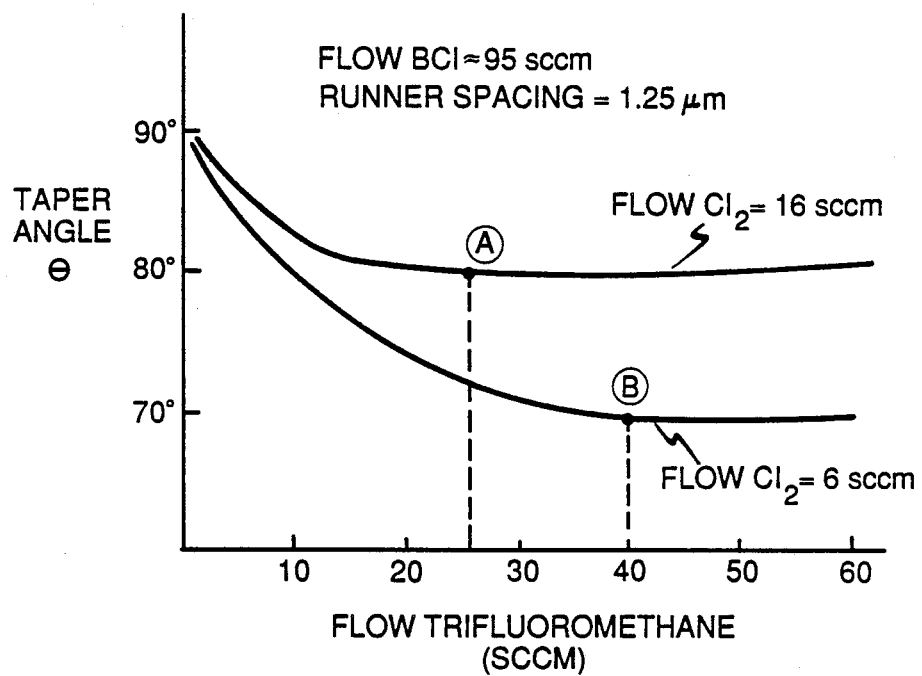

FIG. 4 is a graph which illustrates an experimentally determined relationship (in the principal etch step) between the relative flow rates of chlorine and trifluoromethane and the metal taper angle $\theta$ in an hexagonal cathode etching apparatus. (The data for the graph were obtained for aluminum runners which were created approximately 1.25 $\mu$m apart with an initial mask photoresist thickness of approximately 2 $\mu$m. (The significance of spacing between aluminum runners and of photoresist thickness will be subsequently explained). It will be noted that the graph of FIG. 4 shows achievement of taper angles between ninety and approximately seventy degrees using trifluoromethane flow rates of between zero and 60 sccm (standard cubic centimeters per minute). Chlorine flow rates illustrated on the graph are between six and sixteen sccm. The gas flow also included boron trichloride at a flow rate of approximately 95 sccm.

A better understanding of the data presented in FIG. 4 can be gained if the function of the various gases is explained. Relatively pure chlorine attacks aluminum quickly and somewhat isotropically. Consequently, if chlorine alone were used to etch the exposed aluminum or aluminum rich material which is present in layer 13, an undercut profile would result (i.e. the aluminum would be etched under the mask edge).

Trifluoromethane apparently tends to form a protective polymeric film 23 on the sidewalls of the metal as it is being etched. As the etching process proceeds, more protective polymer is formed and it becomes progressively more difficult for the chlorine to attack the metal. The lateral growth of the polymer on the metal sidewall effectively changes the mask edge during the etch and thereby creates a tapered metal profile.

Thus, examination of the graph of FIG. 4 shows that for constant chlorine flow, increasing amounts of trifluoromethane tend to create smaller taper angles $\theta$. Correspondingly, for constant trifluoromethane flow, increasing amounts of chlorine tend to create larger taper angles $\theta$. Thus, the graph of FIG. 4 aids in choosing process conditions designed to achieve a desired taper angle for runners spaced approximately 1.25 $\mu$m apart.

Preliminary results indicate that the data displayed in FIG. 4 may be interpolated, i.e. a curve for a chlorine flow of 10 sccm is between the curves for chlorine flow of 16 sccm and 6 sccm displayed on the graph.

In general, aluminum layers contain a stable native oxide surface. The oxide frequently etches at a much slower rate than the aluminum layer itself. The slowness of the oxide etch can cause an irregular incubation period at the start of the etching process. The incubation period is difficult to take into account when timing is used to predict the endpoint. On other occasions, the resulting etched surface can be rough because of slight nonuniformities in the oxide thickness. Consequently, boron trichloride is added at least at the start of the etch process to scavenge oxygen and water vapor and to insure removal of any aluminum oxide.

The above-described taper etching procedure may be used to produce a tapered aluminum profile which may be useful in a variety of circumstances. For example, copending application, designated F. H. Fischer et al. 4-10-2-1, assigned to the same assignee as the present invention and incorporated herein by reference, may advantageously employ the present invention to form aluminum runners with regions of reduced thickness within each runner for subsequent laser severing. In addition, the present invention may be used to form tapered sidewalls on closely spaced metal runners. The tapered sidewalls may facilitate subsequent deposition of dielectric layers.

FIG. 5 is a graph which illustrates the experimentally determined relationship between the measured taper angle and the spacing between metal runners. The upper curve corresponds to process point "A" in FIG. 4, while the lower curve corresponds to process point "B" in FIG. 4. Thus, on a wafer processed under process "A", runners at 1.25 $\mu$m spacing will exhibit a taper angle $\theta$ of approximately eighty degrees. However, runners separated by more than 10 $\mu$m of approximately eighty degrees. However, runners separated by more than 10$\mu$m will exhibit a taper angle $\theta$ of approximately seventy degrees. Similarly, if process "B" were employed, runners at approximately 1.25 $\mu$m spacing would exhibit a taper angle $\theta$ of approximately seventy degrees. If process "B" were employed, runners separated by more than approximately 10 $\mu$m will exhibit a taper angle of approximately sixty degrees. Thus, the graph of FIG. 5 aids in choosing process conditions to achieve a desired taper angle for a given spacing between runners. (Should processes with gas flows significanltly different from those corresponding to process points "A" or "B" in FIG. 4 be utilized, a new set of curves must be constructed to correspond to FIG. 5. Such construction is easily accomplished by one skilled in the art.

The results presented in FIGS. 4 and 5 were obtained for a constant thickness of photoresist (2 $\mu$m HPR 206). Preliminary investigations show that the taper angle $\theta$ may decrease slightly with decreasing photoresist thickness. The general shape of the curves obtained for lesser photoresist thickness is similar to those shown in FIGS. 4 and 5, however. The following examples are illustrative of the invention:

EXAMPLE 1

To achieve an approximately 80 degree taper angle on aluminum runners that were to be separated by approximately 1.25 $\mu$m, a 5000 Å aluminum-coppersilicon ($\frac{1}{2}$% copper; 0.75% silicon) blanket layer was formed on a chemical vapor deposited silicon oxide. The metal was covered with a 120 Å polysilicon anti-reflection coating and then patterned with a 2.0 $\mu$m HPR 206 photoresist.

The sample was placed in AME 8130 hexode reactor (manufactured by Applied Materials Corporation) with alumina trays. The cathode temperature was 60 degrees Centigrade. Unused positions in the reactor were filled with silicon dummy wafers. The chamber was evacuated and boron trichloride (95 sccm) and helium (160 sccm) were introduced and a pressure of 16 mTorr was maintained. The helium served as a carrier gas. A plasma was struck utilizing an RF frequency of 13.56 Mhz and a power of approximately 610 Watts to yield a self induced bias of −230 Volts. The boron trichloride accomplished a breakthrough of the anti reflective coating and native oxide coating on the metal.

The plasma was extinguished after one minute. Chlorine was introduced at a flow rate of 16 sccm together with the other two gases, maintaining a pressure of 16 mTorr. A plasma was struck and extinguished after one minute. The introduction of chlorine initiated the metal etch process.

Then the principal etch procedure was commenced. Trifluoromethane was added at 24 sccm to the other gases into the chamber, with the same pressure maintained. (The process corresponds to the process point captioned "A" in FIG. 4). A plasma was again struck and maintained until the metal was etched and the underlying oxide was first exposed. The endpoint at which the metal was etched through and the underlying oxide was exposed was detected visually (although spectroscopic measurements are also acceptable). The amount of time required for the principal etch procedure was measured.

A 20 percent overetch was then performed. When the etching process had visually removed the aluminum, the flow rates of trifluoromethane and chlorine were reduced to 18 and 12 sccm respectively and the total pressure was reduced to 12 mTorr. The plasma was extinguished after a period of time equal to twenty percent of the principal etch time span. The chamber was evacuated.

Finally, an ashing/passivation procedure was performed (in the same reactor). The ashing/passivation procedure removes mask 15 and most of polymeric layer 23. The procedure also removes some residual chlorine species which may remain in direct contact with the aluminum and will produce subsequent corrosion of the aluminum. Therefore, an oxygen/tetrafluoromethane mixture was introduced into the chamber at 300 sccm and maintained at 200 mTorr pressure. A plasma was struck with a power of 650 Watts and extinguished after 25 minutes. Then the samples were cleaned in a standard wet cleaning solution to remove residual photoresist and residual polymer.

EXAMPLE 2

A 70 degree taper angle was desired on aluminum runners separated by 1.25 μm and a process similar to that described in Example 1 was followed. However, the principal etch procedure was modified to include 40 sccm trifluoromethane and 6 sccm chlorine (i.e. corresponding to the process point captioned "B" in FIG. 4). When the endpoint was reached, the overetch procedure included the use of 18 sccm Freon and 6 sccm chlorine.

EXAMPLE 3

An approximtely 60 degree taper angle was desired on aluminum runners separated by a comparatively large distance, such as 10 μm. (Such a large distance corresponds to virtually "infinity" on the curve of FIG. 5). An examination of the graph of FIG. 5 shows that the same process utilized in Example 2 (which produced a taper angle of 70 degrees in runners spaced apart by 1.25 μm) may be used successfully.

In the practice of the above-mentioned copending application (F. H. Fischer et al. 4-10-2-1) in which it is desired to form regions of reduced thickness within individual runners, the data corresponding to the approximate diameter of the reduced thickness region (approximately 10 μm) may be utilized in FIG. 5. Consequently, if one should desire to create an approximately 60 degree taper angle in the practice of the above-mentioned Fischer Application, the processes of Example 2 may be used.

The inventive process disclosed herein contains certain advantages over the use of chloroform for aluminum etching. Trifluoromethane is gaseous and generally non-toxic whereas chloroform is a liquid and toxic. Consequently, greater care must be taken in the handling of chloroform. The above- described procedures may be utilized to taper etch certain stacked metal structures without changes of chemistry.

Applicants' investigations have shown that flow ratios of trifluoromethane to chlorine greater than 0.75 and preferably greater than 1.0 have tended to produce desireable taper angles in structures of practical interest.

The present invention is also useful in etching layered structures containing aluminum, tungsten and titanium-tungsten, although some change of chemistry may be necessary to accomplish etching of the tungsten layer.

We claim:

1. A method of semiconductor device fabrication comprising:
   forming a first layer upon a substrate;
   forming a second layer containing aluminum upon said first layer;
   etching both said first and said second layer with a gas mixture, characterized in that said gas mixture contains chlorine and trifluoromethane and said etching step produces a tapered profile.

2. The method of claim 1 in which said gas mixture further contains boron trichloride.

3. The method of claim 1 in which said etching occurs in a plasma environment.

4. The method of claim 1 wherein said first layer is made from a material chosen from the group consisting of: titanium- tungsten and titanium nitride.

5. The method of claim 1 in which the flow ratio of said trifluoromethane and chlorine is at least 0.75.

6. A method of semiconductor device fabrication comprising:
   depositing a layer of titanium-tungsten upon a substrate, said layer containing at least five percent titanium by weight;
   depositing an aluminum rich layer upon said layer of titanium-tungsten layer;
   covering said aluminum rich layer with an anti reflective coating;
   covering said anti reflective coating with a patterned mask, said mask having a thickness of 2 μm or less;
   exposing said aluminum rich layer to boron trichloride;
   exposing said aluminum rich layer said titanium-tungsten layer in a plasma environment to a mixture of chlorine and trifluoromethane, said chlorine having a flow rate of between 16 and 6 sccm and said trifluoromethane having a flow rate less than 60 sccm, said exposing step creating a polymeric layer in contact with said aluminum rich layer and said titanium tungsten layer and creating a tapered sidewall on said aluminum rich layer and said titanium-tungsten layer;

* * * * *